United States Patent
Shih et al.

(10) Patent No.: US 7,247,543 B2
(45) Date of Patent: Jul. 24, 2007

(54) DECOUPLING CAPACITOR

(75) Inventors: Jiaw-Ren Shih, Hsin-Chu (TW);
Jian-Hsing Lee, Hsin-Chu (TW);
Shui-Hung Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 31 days.

(21) Appl. No.: 11/072,014

(22) Filed: Mar. 4, 2005

(65) Prior Publication Data

US 2005/0176195 A1 Aug. 11, 2005

Related U.S. Application Data

(62) Division of application No. 10/694,129, filed on Oct. 27, 2003, now Pat. No. 6,937,457.

(51) Int. Cl.
*H01L 23/62* (2006.01)

(52) U.S. Cl. .................. 438/396; 438/219; 361/56; 257/173; 257/371

(58) Field of Classification Search ........... 438/396, 438/219; 361/56; 257/173, 371
See application file for complete search history.

(56) References Cited

U.S. PATENT DOCUMENTS

| | | | | |
|---|---|---|---|---|
| 5,304,506 A * | 4/1994 | Porter et al. | ............... | 438/394 |
| 5,371,396 A * | 12/1994 | Vinal et al. | ............... | 257/412 |
| 5,547,892 A * | 8/1996 | Wuu et al. | ............... | 438/152 |
| 5,719,733 A * | 2/1998 | Wei et al. | ............... | 361/56 |
| 5,883,423 A * | 3/1999 | Patwa et al. | ............... | 257/532 |
| 6,015,729 A * | 1/2000 | Shirley et al. | ............... | 438/239 |
| 6,081,002 A * | 6/2000 | Amerasekera et al. | ............... | 257/173 |
| 6,320,237 B1 * | 11/2001 | Assaderaghi et al. | ............... | 257/403 |
| 6,429,066 B1 * | 8/2002 | Brown et al. | ............... | 438/239 |
| 6,475,838 B1 * | 11/2002 | Bryant et al. | ............... | 438/153 |
| 6,521,952 B1 * | 2/2003 | Ker et al. | ............... | 257/360 |
| 6,570,225 B2 * | 5/2003 | Parat et al. | ............... | 257/355 |
| 6,624,487 B1 * | 9/2003 | Kunz et al. | ............... | 257/409 |
| 6,674,116 B1 * | 1/2004 | Cao | ............... | 257/312 |
| 6,700,771 B2 | 3/2004 | Bhattacharyya | | |
| 6,750,515 B2 * | 6/2004 | Ker et al. | ............... | 257/357 |
| 6,794,707 B1 * | 9/2004 | Cao | ............... | 257/312 |
| 6,940,705 B2 * | 9/2005 | Yeo et al. | ............... | 361/302 |
| 6,949,806 B2 * | 9/2005 | Wu et al. | ............... | 257/412 |
| 6,963,111 B2 * | 11/2005 | Reddy et al. | ............... | 257/356 |
| 2001/0019285 A1 * | 9/2001 | Lin et al. | ............... | 327/534 |
| 2002/0130366 A1 * | 9/2002 | Morishita | ............... | 257/360 |
| 2003/0007301 A1 * | 1/2003 | Ker et al. | ............... | 361/111 |
| 2005/0122755 A1 * | 6/2005 | Tsutsumi et al. | ............... | 365/51 |

* cited by examiner

*Primary Examiner*—Andy Huynh
*Assistant Examiner*—David Goodwin
(74) *Attorney, Agent, or Firm*—Haynes and Boone, LLP

(57) ABSTRACT

A decoupling capacitor with increased resistance to electrostatic discharge (ESD) is provided on an integrated circuit (IC). The capacitor may be single or multi-fingered. In one example, the capacitor includes first and second electrodes separated by a dielectric material, a source positioned proximate to the first electrode, and a floating drain positioned proximate to the first electrode and separated from the source by the first electrode. A parasitic element, modeled as a bipolar junction transistor (BJT), is formed by current interactions between the source, the floating drain, and a doped area. The floating drain provides a constant potential region at the base of the BJT, which minimizes ESD damage to the IC.

2 Claims, 4 Drawing Sheets

DECOUPLING CAPACITOR

RELATED APPLICATIONS

This application is a divisional of U.S. patent application Ser. No. 10/694,129, filed Oct. 27, 2003, and entitled, "Decoupling Capacitor," which is hereby incorporated by reference in its entirety.

BACKGROUND

The present disclosure relates generally to forming an integrated circuit device on a substrate and, more particularly, to fabricating a decoupling capacitor as part of an integrated circuit.

Integrated circuit (IC) technology generally needs a relatively stable supply voltage that remains within predefined limits. However, an IC typically includes a large number of switches that may rapidly open and close, and such high speed switching may result in transient currents that cause variations in the supply voltage.

To minimize these variations and maintain proper circuit operation, decoupling capacitors may be used to filter at least some of the noise that may be present between operating supplies (e.g., power (Vdd) and ground (Vss)). The decoupling effect of such a capacitor serves to "smooth out" ripples (e.g., waves or pulses) in the operating voltage. Any ripples in the voltage are passed to ground, while direct current (DC) is passed through to the IC's components. When the capacitor is connected across the IC, a transmission line is created with an impedance of $Z=(L/C)^{1/2}$, where 'L' is the inductive component and 'C' is the capacitive component. As illustrated by the above equation, increasing the capacitive component (by using a larger capacitor, for example) provides better decoupling.

Decoupling capacitors may be fabricated from large area thin gate oxide capacitors because such capacitors may achieve a relatively high capacitance per unit area. While this type of capacitor may provide decoupling, it also has a number of drawbacks. For example, because thin gate oxide capacitors generally need a relatively large active area, a large die area (e.g., as much as 20-50% of the die area) may be consumed to realize each decoupling capacitor. Furthermore, such large area capacitors are prone to stress failure, thereby limiting yield and/or reliability. For example, if the oxide layer of the capacitor is not thick enough, a stress point may develop and, with time, may cause the capacitor to fail. Alternatively, the capacitor may fail immediately if the oxide layer has a thin hole or other defect. In addition, a large semiconductor resistance may result in a considerable RC time constant, preventing larger capacitors from performing satisfactorily at higher frequencies (e.g., 100 MHz).

In addition to the need for decoupling, electrostatic discharge (ESD) is generally an important issue for ICs. An ESD is generated by a high field potential, which causes 'charge-and-discharge' events (e.g., a rapid flow of electrons between two bodies of unequal charge or between one charged body and ground, with an electronic circuit being the path of least resistance between the two). An ESD may damage an IC by causing leakage currents or functional failures, and may even destroy an IC.

Various ESD simulation models exist, including the Human Body Model (HBM) and the Machine Model (MM). Since the human body has a charge-storage capacitance and a highly conductive sweat layer, the discharge from a person's touch may be simulated with the HBM using a resistor-capacitor (or RC) circuit. A IC device should generally survive an ESD of 2000V or higher with the HBM. The MM uses an ESD simulation test based on a discharge network consisting of a charged capacitor and (nominally) zero ohms of series resistance to approximate the electrostatic discharge from a machine. An IC device should generally survive an ESD of 200V or higher with the Machine Model.

Decoupling capacitors that are used to reduce coupling (e.g., Vdd and Vss power noise) may result in strong current spikes and thus degrade ESD performance. Furthermore, Vdd pad areas on commonly used decoupling capacitors, such as thin oxide capacitors, that occupy a large active area may fail at undesirably low ESD levels. For example, a conventional pad structure without a decoupling capacitor may have tested values of HBM 7.5 KV and MM 350V. However, when the pad structure is associated with a decoupling capacitor, the tested voltages at which an IC fails using the HBM and MM may be reduced to less than the desired ESD voltage levels.

Therefore, what is needed is a decoupling capacitor that combines decoupling with improved ESD resistance.

SUMMARY

In one embodiment, a decoupling capacitor formed on an integrated circuit is provided. The capacitor comprises first and second electrodes separated by a dielectric material, a source positioned proximate to the first electrode, and a floating drain positioned proximate to the first electrode and separated from the source by the first electrode. The floating drain enhances an ability of the decoupling capacitor to withstand electrostatic discharges.

In another embodiment, a multi-fingered decoupling capacitor with electrostatic discharge resistance is provided. The decoupling capacitor comprises first and second fingers and a floating drain. The first finger comprises first and second electrodes separated by a dielectric material, and a first source positioned proximate to the first electrode. The second finger comprises third and fourth electrodes separated by a dielectric material, and a second source positioned proximate to the third electrode. The floating drain is positioned proximate to the first and third electrodes and separated from the first source by the first electrode and from the second source by the third electrode. The floating drain enhances an ability of the decoupling capacitor to withstand electrostatic discharges.

DETAILED DESCRIPTION

Figure 1:
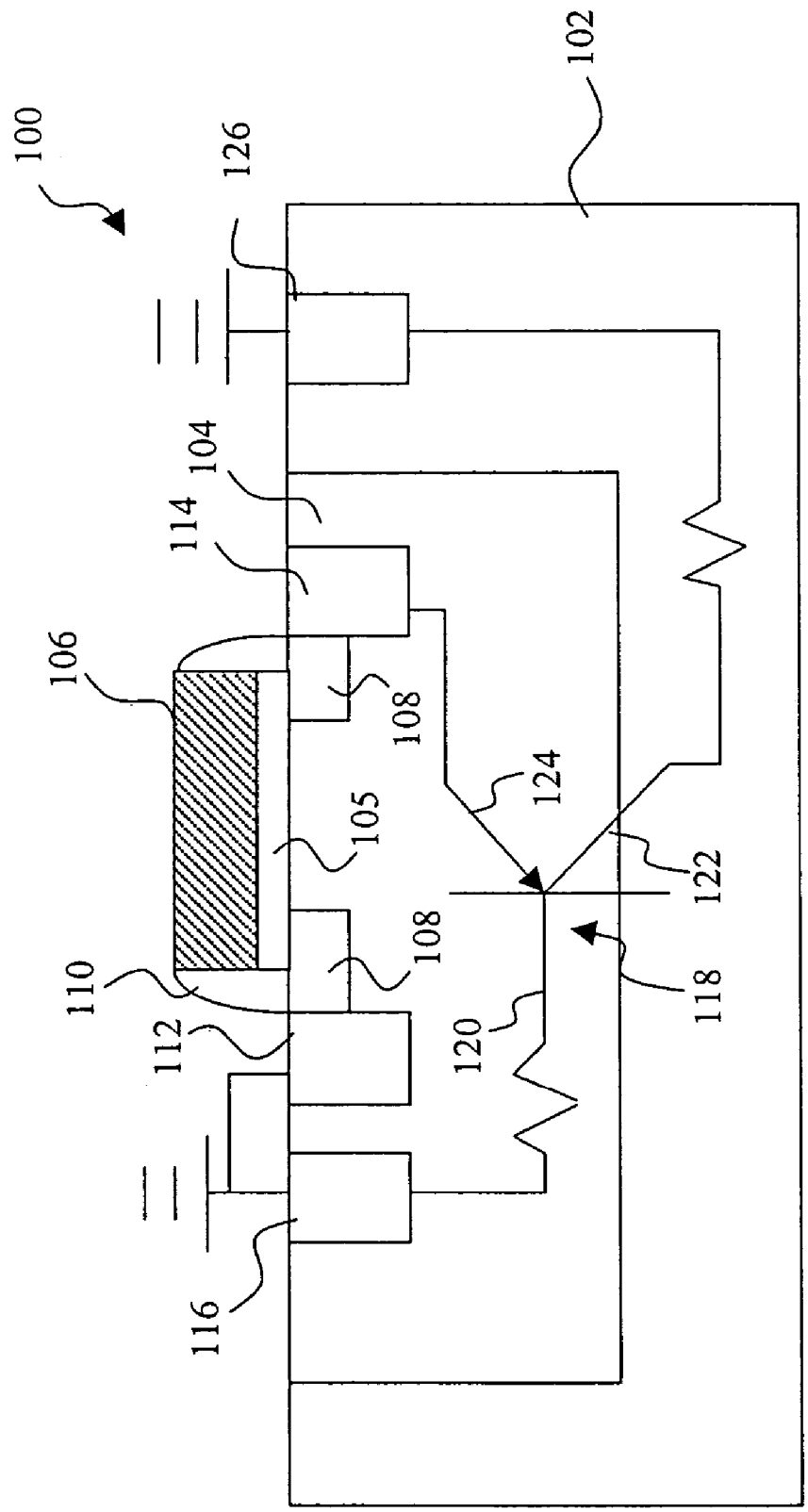
FIG. 1 is a cross-sectional view of one embodiment of a decoupling capacitor having a floating drain.

The present disclosure relates generally to forming an integrated circuit device on a substrate and, more particularly, to fabricating a decoupling capacitor as part of an integrated circuit. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As will be described below in greater detail, metal oxide semiconductor (MOS) technologies may be used to overcome some of the difficulties presented by using thin oxide capacitors as decoupling capacitors. It is noted that any MOS technology may be used to form the decoupling capacitors described herein, including sub-micron processes and the use of ultra-thin oxide. In the present disclosure, the capacitors may be single or multi-fingered, and have floating drains for reasons described below.

Referring to FIG. 1, in one embodiment, a device 100, such as may be used as a decoupling capacitor with an increased resistance to ESD, is illustrated. In the present example, the device 100 comprises a single-fingered positive-channel MOS (PMOS) structure, although it is understood that a negative-channel MOS (NMOS) structure may be also be used.

The device 100 includes a P− doped substrate 102. An isolation layer (not shown) is formed in the substrate 102 to electrically isolate device areas. A well region 104 may be formed by ion implantation. For example, the well region 104 may be formed by growing a sacrificial oxide on the substrate 102, opening a pattern for the location of the well, and then using a chained-implantation procedure, as is known in the art. It is understood that the substrate 102 may have a N− doped well or a combination of N and P wells.

Figure 4:
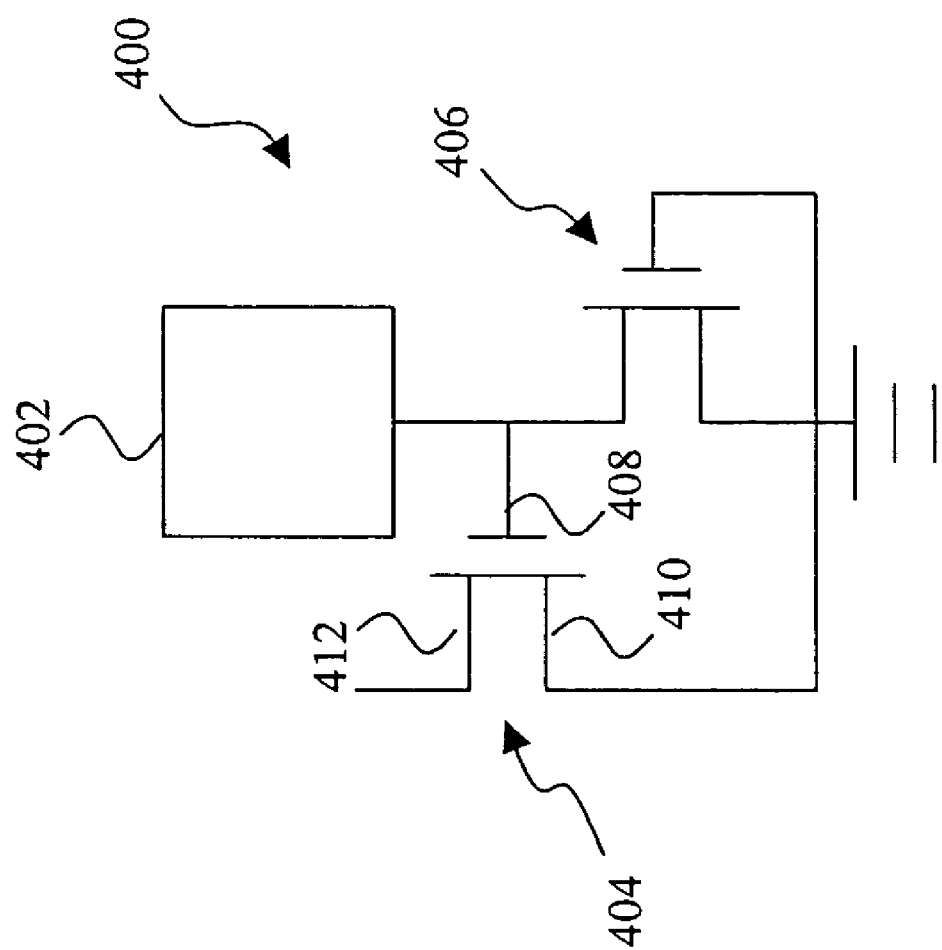
FIG. 4 is a schematic diagram of a MOS capacitor connected to an I/O pad as a decoupling capacitor.

A gate oxide layer 105 may then be formed, followed by the formation of a polysilicon gate structure 106 that comprises a layer of polysilicon deposited by a process such as low pressure chemical vapor deposition (LPCVD). The polysilicon gate 106 is connected to Vdd, frequently via a Vdd pad (FIG. 4). Source and drain extensions (SDEs) 108 (e.g., lightly P− doped areas for a source and drain) in the substrate 102 may be formed by low energy implantation.

A spacer 110 may be formed by LPCVD by, for example, depositing an insulating material such as silicon nitride or silicon oxide. The deposited silicon nitride or silicon oxide layer may then be anisotropically etched back to form the spacer. Heavily P+ doped source and drain regions 112, 114, respectively, may be formed by ion implantation. These regions function as source and drain contact areas. A rapid thermal annealing (RTA) step may be used to activate the implanted dopants. The source 112 is connected to an N+ guard ring 116 and grounded. In the PMOS structure of the device 100, the drain 114 is floating.

A parasitic element 118, illustrated as a PNP bipolar junction transistor (BJT) with a base 120, collector 122, and emitter 124, exists in the device 100. The parasitic element 118 may be formed by current interactions among the P+ drain 114, the N+ guard ring 116, and a heavily doped P+ area 126. In the present example, the doped area 126 is a source (such as the source 112) for a second transistor (not shown). The nature of parasitic BJT snapback (e.g., a negative differential resistance regime) may present undesired effects in both single and multi-finger devices. As is known, if the PMOS structure is incorrectly designed, an arbitrary finger (in a multi-fingered device) may be triggered into voltage snapback. This drives all current through that finger, rather than distributing the current through each of the fingers. If the current going through the finger is high enough, it may result in failure due to early local current collapse accompanied by filamentation and thermal runaway.

The use of a floating drain provides the parasitic element 118 with a constant potential region at the base 120. This reduces the thin oxide electric field near the polysilicon gate 106 and also reduces the tunnel current, resulting in decreased Vdd pad ESD susceptibility. Furthermore, the constant potential region appears to help distribute the current more evenly through the fingers of a multi-fingered device during snapback. Accordingly, the floating drain 114 enables the device 100 to serve as a decoupling capacitor while also providing increased ESD resistance when compared to structures without a floating drain.

Figure 2:
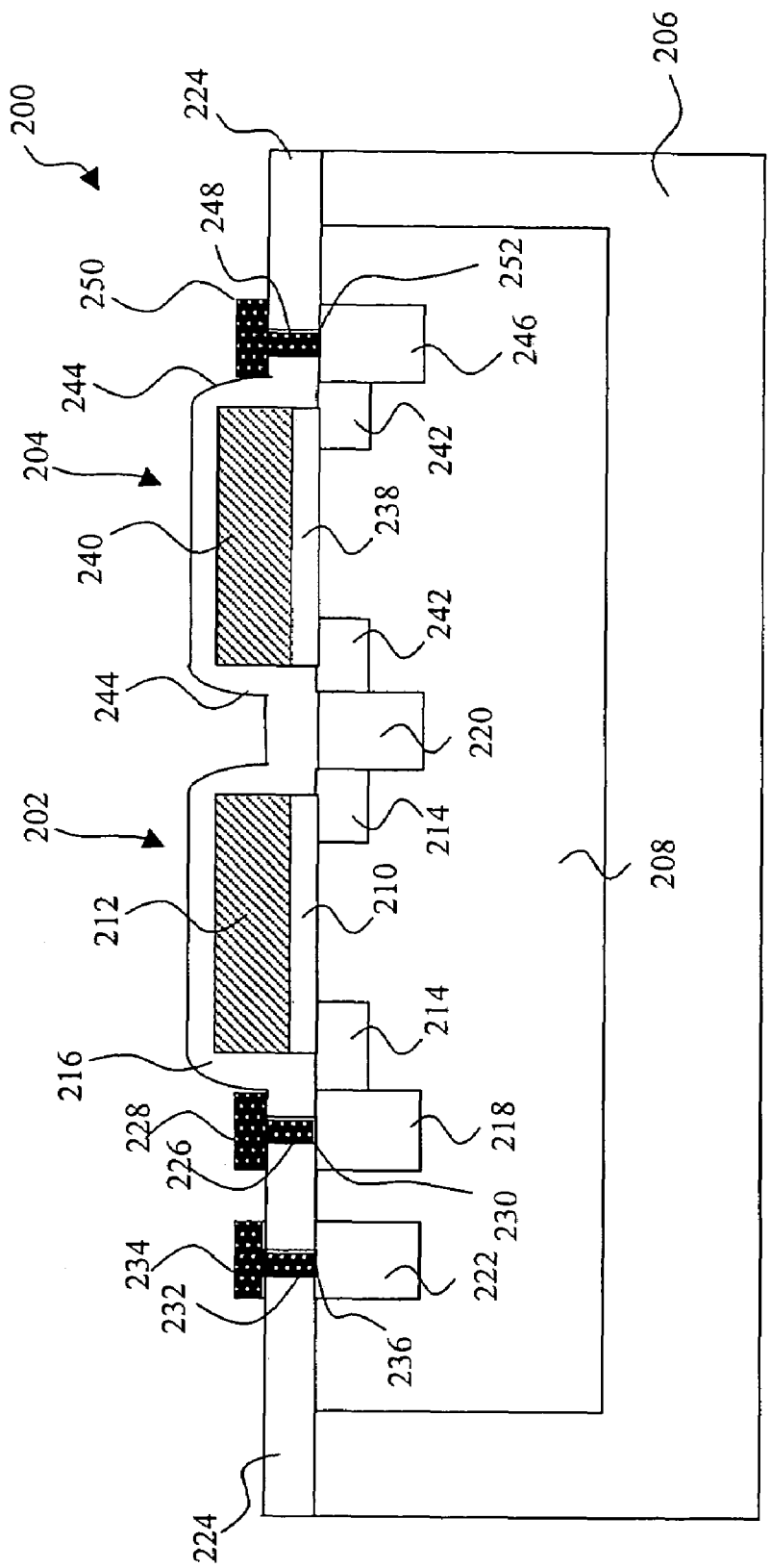
FIG. 2 is a cross-sectional view of a portion of an integrated circuit showing two metal oxide semiconductor (MOS) capacitors that are connected to form a decoupling capacitor.

Referring now to FIG. 2, in another embodiment, a portion of an IC 200 includes two capacitors 202, 204, which are connected to form a decoupling capacitor with an increased resistance to ESD. The device 200 includes a substrate 206, which is P− doped in the present example. An isolation layer (not shown) is formed in the substrate 206 to electrically isolate device areas. An N− well region 208 may be formed by ion implantation, as described in reference to FIG. 1.

A gate oxide layer 210 may be formed for the capacitor 202, followed by a P+ polysilicon gate 212 and lightly doped P− SDEs 214. A spacer 216 may be formed proximate to the gate oxide layer 210 by LPCVD. The spacer 216 may be formed by depositing an insulating material such as silicon nitride or silicon oxide, which is then anisotropically etched back to form the spacer.

Heavily doped P+ source and drain regions 218, 220, respectively, may be formed by ion implantation. These regions function as source and drain contact areas. A rapid thermal annealing (RTA) step may be used to activate the implanted dopants. The source 218 is connected to an N+ guard ring 222 (that surrounds the decoupling capacitors 202, 204) and grounded. The polysilicon gate 212 connects to Vdd.

The drain 220 is floating. As described previously with respect to FIG. 1, the capacitor 202 is associated with a parasitic element that may be modeled as a BJT. The floating drain 220 provides the capacitor 202 with a constant potential region at the base of the BJT, which reduces the thin oxide electric field near the polysilicon gate 212 and also reduces the tunnel current. This provides the IC 200 with increased ESD resistance when compared to structures without a floating drain.

An intermediate dielectric layer 224 may be deposited on the device 200, and holes may be etched through the intermediate dielectric layer 224 to the source 218 and the guard ring 222. Because the drain 220 is floating, no contact opening is provided for the drain through the intermediate dielectric layer 224. A conductive layer may then be deposited into the hole associated with the source 218. In the present example, the conductive layer includes a conductive plug 226, a conductive line 228, and a barrier metal layer 230. A similar conductive layer comprising a conductive plug 232, a conductive line 234, and a barrier metal layer 236 may also be deposited into the hole associated with the guard ring 222.

The structure of the capacitor 204 is similar to that of the capacitor 202, with the two capacitors sharing the floating drain 220. Accordingly, the capacitor 204 includes a gate oxide layer 238, a polysilicon gate structure 240 and lightly doped SDEs 242. A spacer 244 may be formed proximate to the gate oxide layer 238.

A heavily doped P+ source 246 functions as a source contact area that connects to an N+ guard ring (not shown, but similar or identical to guard ring 222) and grounded. As described previously, the drain 220 is floating. The capacitor 204's source 246 connects to Vss and the polysilicon gate 240 connects to Vdd. The intermediate dielectric layer 224 is also deposited on the capacitor 204, with a hole etched through the intermediate dielectric layer 224 to the source 246. As with the source 218, a conductive layer is deposited into the hole associated with the source 246, with the conductive layer forming a conductive plug 248, a conductive line 250, and a barrier metal layer 252.

It is understood that the capacitors 202, 204 may be fabricated simultaneously, with each corresponding layer fabricated at the same time. For example, the corresponding gate oxide layers 210 and 238 may be fabricated simultaneously.

Figure 3:
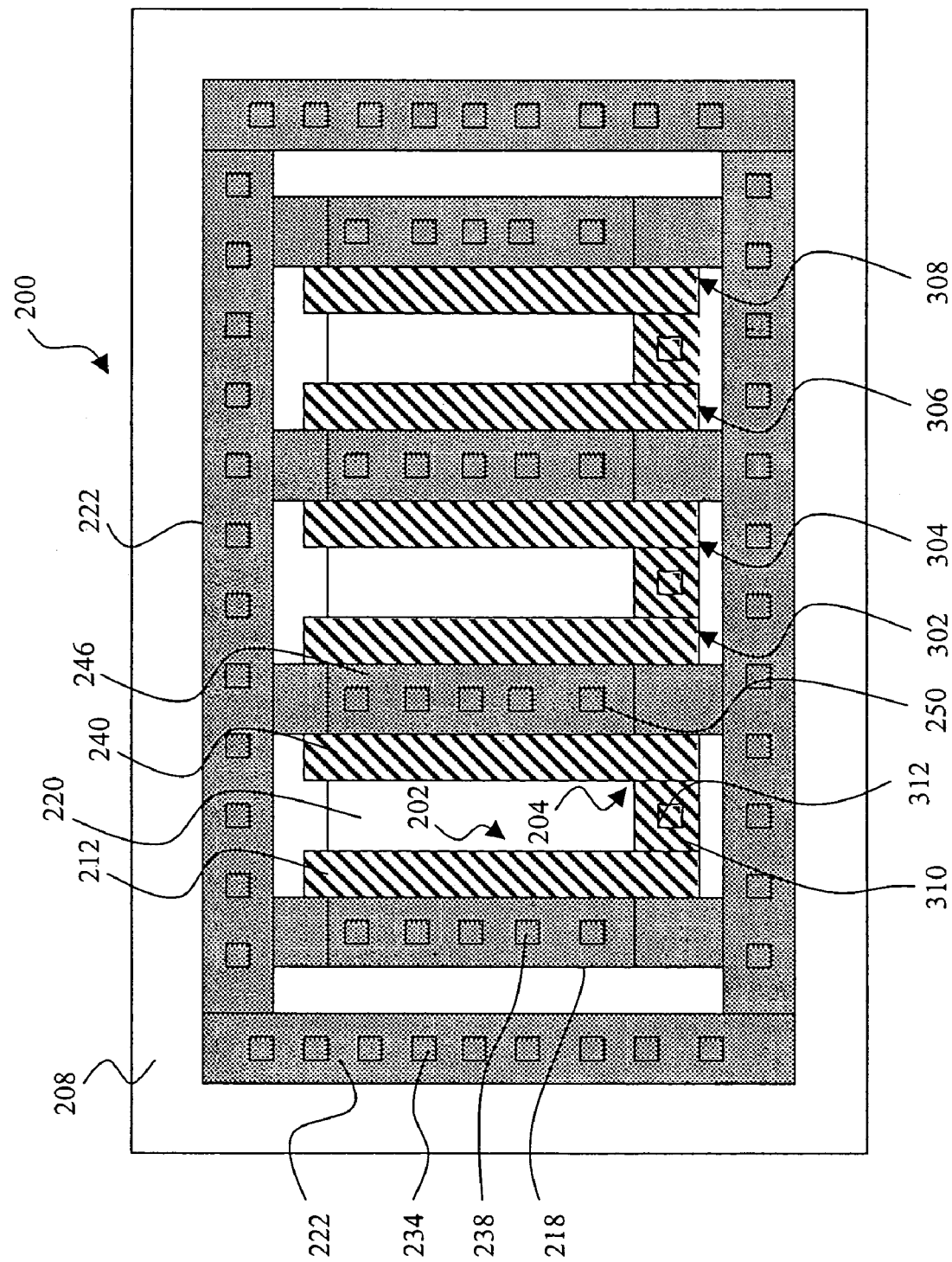
FIG. 3 is a top view of the integrated circuit of FIG. 2 illustrating the two MOS capacitors connected to additional capacitors to form a larger decoupling capacitor.

Referring now to FIG. 3, in still another embodiment, a top view of a portion of the IC 200 of FIG. 2 illustrates six MOS capacitors, including the capacitors 202 and 204 of FIG. 2, as well as additional capacitors 302, 304, 306, and 308. The six capacitors may be connected to form a large multi-fingered decoupling capacitor. As the capacitors 302-308 are similar in structure and operation to the capacitors 202 and 204, only the capacitors 202 and 204 will be discussed in detail in FIG. 3.

As noted in the previous discussion of FIG. 2, the source of each capacitor 202, 204 is connected to the guard ring 222 and $V_{SS}$ through a conductive line (e.g., the conductive lines 228, 250 for the capacitors 202, 204, respectively). The two neighboring polysilicon gates 212, 240 are connected through a P+ polysilicon line 310 and polysilicon contact 312. The floating drain 220 (and the corresponding floating drains associated with the capacitors 302-304), enable the IC 200 to distribute current more evenly during snapback.

Referring now to FIG. 4, a structure 400 includes a Vdd pad 402, a MOS decoupling capacitor 404, and a MOS transistor 406 as a I/O output. The decoupling capacitor 404 includes a gate 408 connected to Vdd, a source 410 connected to ground, and a floating drain 412. High frequency noise will pass through the decoupling capacitor 404, with the floating drain structure increasing ESD resistance. As described with respect to FIGS. 1-3, the decoupling capacitor 404 may comprise a single capacitor or may be a combination of multiple capacitors. If multiple capacitors are used, the gate of each capacitor would be connected to Vdd, the source of each capacitor would be connected to Vss, and the drain of each capacitor would be floating.

Accordingly, MOS decoupling capacitors having floating drains may provide improved electrostatic discharge (ESD) protection when compared to other decoupling capacitor structures, such as thin oxide capacitors. For example, when performing ESD tests using an existing thin oxide capacitor as a decoupling capacitor for IC I/O, Vdd pad failure generally occurred at a relatively low ESD level. However, similar tests using an NMOS capacitor structure with a floating drain illustrated improvements in ESD protection from 1.5KV to 2.5KV for HBM and from 75V to 200V for MM. Using a PMOS capacitor structure resulted in even more ESD protection, going from 1.5KV to 4KV for HBM and 100V to 275V for MM.

The MOS decoupling capacitors of the present disclosure generally use less space than conventional thin oxide capacitors. Additionally, they may be created as a single capacitor, which has no impact on other layers of the design. Furthermore, MOS decoupling capacitors may be created using conventional MOS processes. Each MOS capacitor acts as a capacitor unit and multiple units may be used in parallel.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method for fabricating a decoupling capacitor with increased resistance to electrostatic discharges on an integrated circuit, the method comprising:
   forming a well region in a substrate;
   forming a gate oxide layer above the well region;
   forming a polysilicon gate structure above the gate oxide layer;
   forming a source region proximate to the gate oxide layer;
   forming a drain region proximate to the gate oxide layer and opposite the source region;
   forming a first node in the well region of a conductivity type opposite to that of the source region;
   forming a second node in the substrate of a conductivity type opposite to that of the first node;
   covering the polysilicon gate structure, the source region, the drain region, and the first and second nodes with a dielectric layer; and
   forming, through the dielectric layer, a first interconnection to the source region and a second interconnection to the polysilicon gate structure, while leaving the dielectric layer above the drain region intact, wherein the drain region is not connected to an interconnection and is floating;
   forming another polysilicon gate structure for a second decoupling capacitor; and
   connecting the polysilicon gates with a polysilicon line, so that the two decoupling capacitors are combined into a single decoupling capacitor.

2. The method of claim 1 further comprising:
   the first node being formed as a guard ring; and
   connecting the source region to the guard ring.

* * * * *